(12) United States Patent
Vankayala (10) Patent No.: US 10,684,797 B2
(45) Date of Patent: Jun. 16, 2020

(54) COMMAND-IN-PIPELINE COUNTER FOR A MEMORY DEVICE

(71) Applicant: MICRON TECHNOLOGY, INC., Boise, ID (US)

(72) Inventor: Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/119,766

(22) Filed: Aug. 31, 2018

(65) Prior Publication Data

US 2020/0073589 A1 Mar. 5, 2020

(51) Int. Cl.
G06F 3/06 (2006.01)
G11C 7/10 (2006.01)
G11C 7/22 (2006.01)
H03K 23/40 (2006.01)
H03K 19/20 (2006.01)

(52) U.S. Cl.
CPC .......... G06F 3/0659 (2013.01); G06F 3/0604 (2013.01); G06F 3/0653 (2013.01); G06F 3/0673 (2013.01); G11C 7/1084 (2013.01); G11C 7/222 (2013.01); H03K 23/40 (2013.01); H03K 19/20 (2013.01)

(58) Field of Classification Search
CPC ..... G06F 3/06–0689; G06F 9/38–3897; G06F 12/00–16; H03K 23/40
See application file for complete search history.

(56) References Cited

U.S. PATENT DOCUMENTS

| 4,133,029 | A | * | 1/1979 | Ruckdeschel | G06F 15/167 710/38 |
|---|---|---|---|---|---|
| 5,253,048 | A | * | 10/1993 | Mori | H04N 1/648 358/518 |
| 5,528,177 | A | * | 6/1996 | Sridhar | G06F 7/00 326/113 |
| 6,023,759 | A | * | 2/2000 | Omtzigt | G06F 9/30003 712/227 |
| 2011/0007587 | A1 | * | 1/2011 | Morgan | G11C 7/1078 365/194 |
| 2011/0320790 | A1 | * | 12/2011 | Dieffenderfer | G06F 9/3806 712/239 |
| 2014/0157055 | A1 | * | 6/2014 | Mozak | G06F 11/263 714/33 |
| 2016/0077940 | A1 | * | 3/2016 | Son | G06F 11/2094 714/6.22 |

* cited by examiner

Primary Examiner — Nicholas J Simonetti
(74) Attorney, Agent, or Firm — Fletcher Yoder, P.C.

(57) ABSTRACT

Memory devices and methods utilize pipelines to process or control timing of commands received by the memory device. They may also use tracking circuitry configured to determine whether one or more of the commands are in the pipeline. The tracking circuitry includes an input counter configured to count commands entering into the pipeline and an output counter configured to count commands exiting the pipeline. Furthermore, the tracking circuitry includes comparison circuitry configured to compare values in the input counter and the output counter and to output a command-in-pipeline signal indicative of the one or more commands being in the pipeline when the values in the input counter and the output counter differ.

21 Claims, 5 Drawing Sheets

COMMAND-IN-PIPELINE COUNTER FOR A MEMORY DEVICE

BACKGROUND

Field of the Present Disclosure

Embodiments of the present disclosure relate generally to field command detection in memory devices. More specifically, embodiments of the present disclosure relate to using a counter scheme for detecting commands in pipelines of the memory device.

Description of Related Art

Semiconductor devices (e.g., memory devices) utilize commands (e.g., read or write commands received from a host device). When the command is passing through a pipeline of the semiconductor device, the command has started and is in progress. The semiconductor devices may track these commands and determine whether they are in the pipeline. However, tracking circuitry used to track these commands may buffer outputs of various parts of the pipeline and may consume power and layout space for the semiconductor devices.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Tracking circuitry of a memory device may be used to track whether a command is in a pipeline of the memory device. The tracking circuitry may include an input counter that counts how many commands have entered into the pipeline and an output counter that counts how many commands have exited the pipeline. The tracking circuitry may also include compensation circuitry that compares counts in the input counter and the output counter. When the counts in the input counter and the output counter are the same, the tracking circuitry determines that all commands have passed through the pipeline. When the counts in the input counter and the output counter are not the same, the tracking circuitry determines that at least one command is still in the pipeline.

Figure 1:
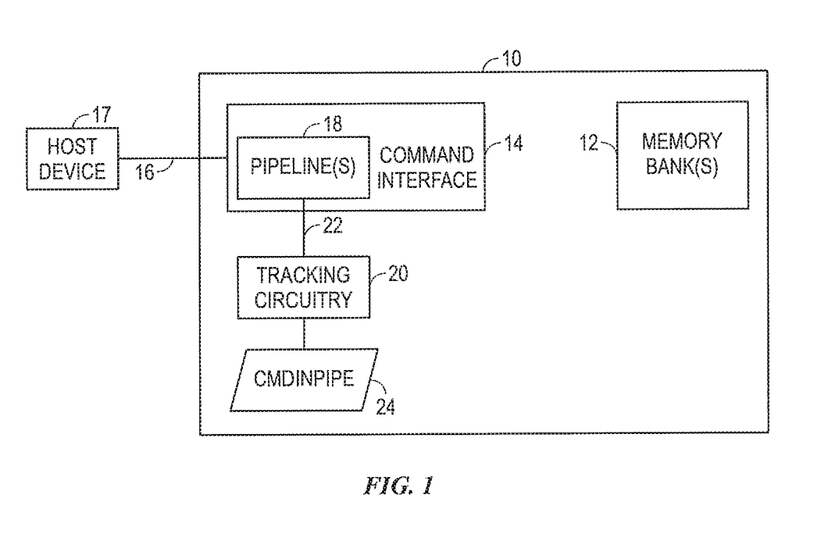
FIG. 1 is a simplified block diagram illustrating certain features of a memory device having tracking circuitry that tracks whether a command is in a pipeline of the memory device, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type 4 (DDR4) or double data rate type 5 (DDR5) synchronous dynamic random-access memory (SDRAM) device.

The memory device 10, may include a number of memory banks 12. The memory banks 12 may be DDR4 or DDR5 SDRAM memory banks, for instance. The memory device 10 represents a portion of a single memory chip (e.g., SDRAM chip) having a number of memory banks 12. Furthermore, the memory banks 12 may be further arranged to form bank groups. For instance, for an 8 gigabyte SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14. The command interface 14 is configured to provide a number of signals (e.g., commands 16) from an external device, such as a processor or controller 17. The processor or controller 17 may provide various commands 16 (and/or other clocks/signals) to the memory device 10 to facilitate the transmission and receipt of data to be written to or read from the memory device 10.

As will be appreciated, the command interface 14 may include a number of circuits to ensure proper handling and/or decoding of the commands 16. Commands 16 passing through the command interface 14 are passed to one or more appropriate pipelines 18. The pipelines 18 may include circuitry that processes and/or controls timing of processing of the command 16. The pipelines 18 may be implemented within the command interface 14 and/or outside of the command interface 14.

Tracking circuitry 20 may be used to determine when the command 16 has reached one or more specific locations in the pipelines 18 using signals 22. When the tracking circuitry 20 determines that the command 16 is in the pipeline 18, it outputs a CmdInPipe signal 24 indicative that the command 16 is in the pipeline 18. The memory device 10 may generate one or more CmdInPipe signals 24 indicative of one or more commands 16 located in the pipeline 18.

Figure 2:
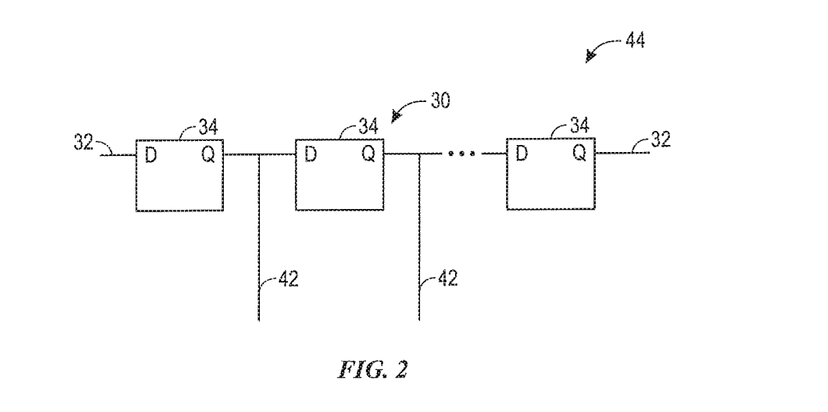
FIG. 2 is a simplified block diagram of the pipeline of FIG. 1, in accordance with an embodiment.

FIG. 2 illustrates a simplified block diagram of a pipeline 30. For example, the pipeline 30 may be an additive latency shifter. The additive latency shifter may be used to shift commands through to add latency to achieve a column access strobe (cas) latency for the memory device 10. For instance, in DDR4 and DDR5 implementations, the memory device 10 may support a high read latencies. A high read latency results in very high additive latencies as well. For example, in a DDR4 device, an additive latency shifter may be used to add an additive latency of up to 31 cycles when the cas latency is set to 32 in a mode register for the memory device 10. In the additive latency shifter, a read/write command 32 is latched and shifted up to 32 times using flip-flops 34. The output of each of the latches are sampled using signals 42 that are buffered. The buffered signals 42 are sent to a common location where they are tested together.

Figure 3:
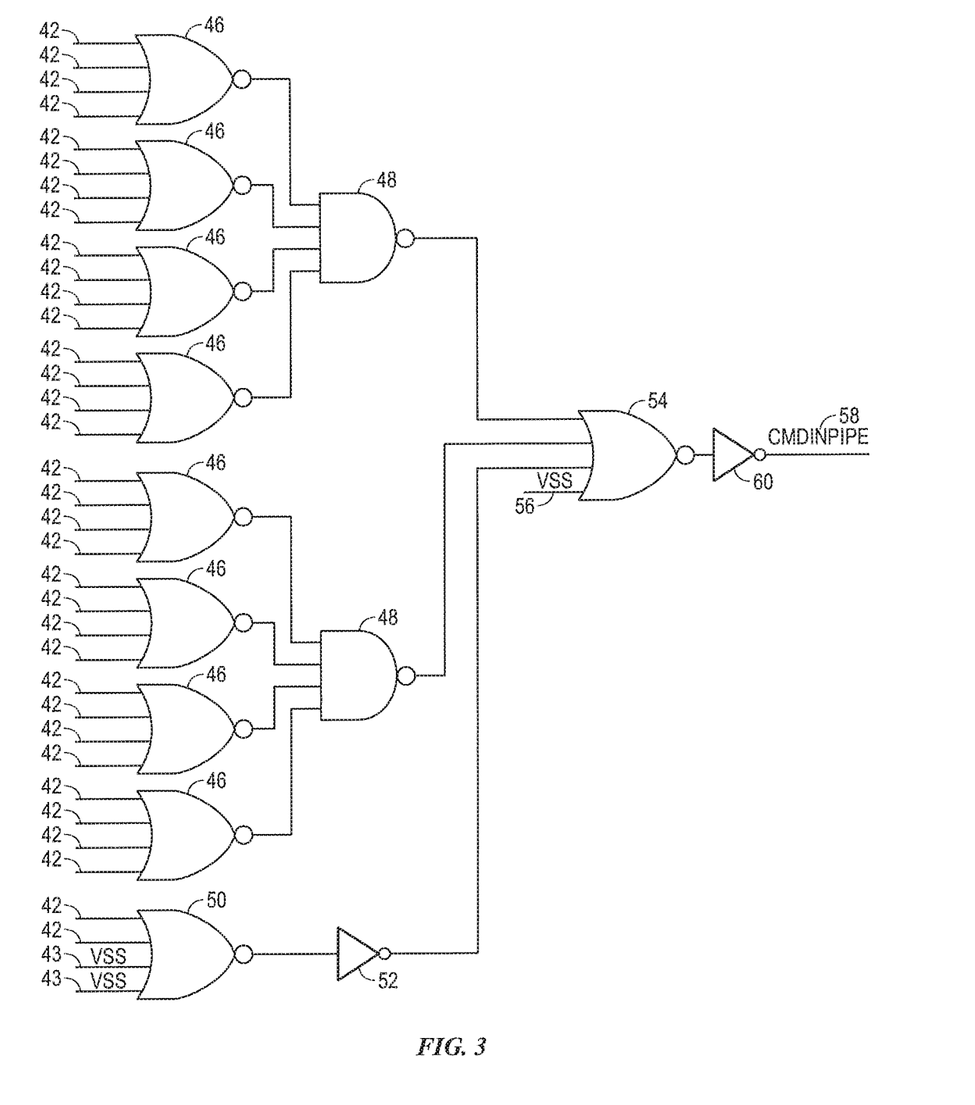
FIG. 3 is a schematic diagram of OR circuitry used to determine whether the pipeline of FIG. 2 has a command in the pipeline, in accordance with an embodiment.

For example, FIG. 3 illustrates a schematic diagram of OR circuitry 44 that receives the signals 42. The signals 42 are passed to NOR gates 46. When not all of the inputs of NOR gates 46 correspond to a respective signal 42, VSS 43 may be connected instead. The outputs of the NOR gates 46 are in turn passed to NAND gates 48. Any single NOR gate 50 that does not connect to the NAND gates 48 may instead utilize an inverter 52 to logically align with the outputs of the NOR gates 46. The outputs of the NAND gates 48 and the NOR gate 50 are connected to a NOR gate 54. Any inputs of the NOR gate 54 that are not connected to an output of the NAND gates 48 or the NOR gate 50 may be connected to VSS 56. The output of the NOR gate 54 is used to generate a CmdInPipe signal 58 that indicates that the read/write command 32 is in the pipeline 30. The CmdIn-Pipe signal 58 may be generated using one or more inverters 60 to achieve proper timing, logic, and/or amplification for the CmdInPipe signal 58. Although the buffering of the signal 42 from the pipeline 30 used to generate the OR circuitry 44 may track whether the read/write command 32 is in the pipeline 30, the buffering scheme may consume key resources of the memory device 10. For example, the buffering of the signals 42 increases power consumption and layout space used. Furthermore, in the additive latency shifter location routing of the signals 42 may take up valuable routes in a critical location of the memory device.

Figure 4:
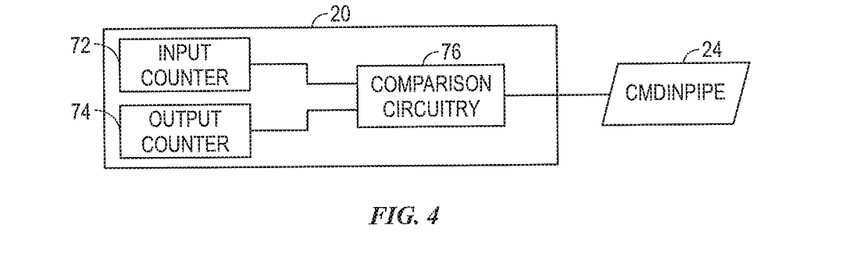
FIG. 4 is a block diagram of the tracking circuitry of FIG. 1 having an input counter, an output counter, and comparison circuitry, in accordance with an embodiment.

As illustrated in FIG. 4, instead of buffering every stage of the pipeline 30, the tracking circuitry 20 counts incoming commands using an input counter 72 that counts pulses (e.g., commands 16) passing into the pipeline 30 at (e.g., before first flip-flop 34) or near a beginning (e.g., after first flip-flop 34) of the pipeline 30. The tracking circuitry 20 may also count outgoing commands using an output counter 74 that counts pulses (e.g., commands 16) passing out of the pipeline 30 at (e.g., after last flip-flop 34) or near an end (e.g., after last flip-flop 34) of the pipeline 30. The tracking circuitry 20 may compare the two counts using comparison circuitry 76. When the input and output counts are different the CmdInPipe signal 24 is held to a logic high indicating that a command is in the pipeline 30. Once all the commands are completed (i.e., passed through the pipeline 30) and there are no new commands in the pipeline 30, the input and output counts will match, and the CmdInPipe signal 24 transitions low indicating that no commands are in the pipeline 30.

Figure 5:
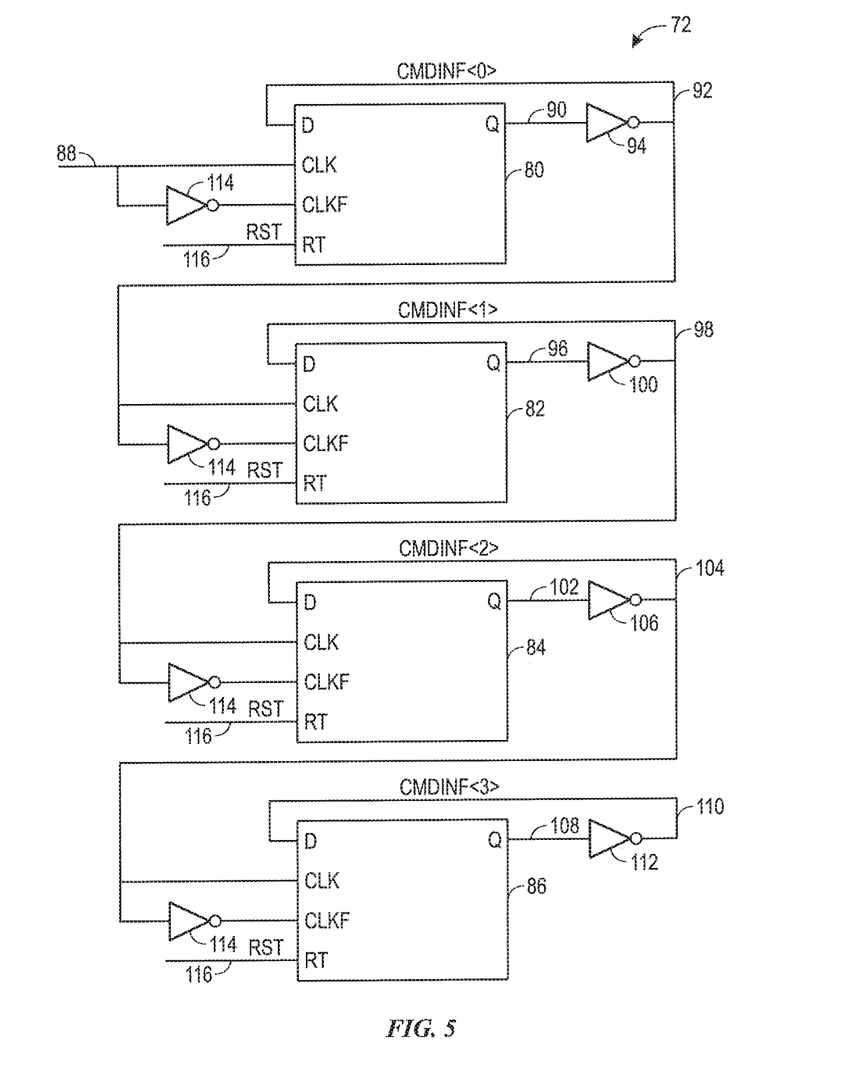
FIG. 5 is a schematic diagram of the input counter of FIG. 4, in accordance with an embodiment.

FIG. 5 illustrates a schematic diagram of an embodiment of the input counter 72. As illustrated, the input counter 72 includes a ripple counter. However, the input counter 72 may include any type of counter suitable for counting a number of commands entering the pipeline 18. In the illustrated embodiment, the input counter 72 includes flip-flops 80, 82, 84, and 86. The flip-flop 80 receives a signal 88 (e.g., signal 42) indicative of a command 16 detected at or near a beginning of the pipeline 18. The signal 88, when transitioning high, clocks the flip-flop 80 causing the flip-flop 80 to output a Cmdin<0> signal 90. The input counter 72 then inverts the Cmdin<0> signal 90 to generate a CmdinF<0> signal 92 using an inverter 94. The CmdinF<0> signal 92 is then fed back into an input pin of the flip-flop 80 to cause the output of the flip-flop 80 to toggle on the next high transition of the signal 88. In other words, the output of the flip-flop 80 alternatively toggles high and low on receiving each (e.g., high) pulse of the signal 88.

The flip-flop 82 functions similar to the flip-flop 80 except that the flip-flop 82 is clocked using the CmdinF<0> signal 92 instead of the signal 88. Thus, the flip-flop 82 output (i.e., Cmdin<1> signal 96) toggles with every other transition of the CmdinF<0> signal 92 due to the feedback into the flip-flop 82 of a CmdinF<1> signal 98 inverted from the Cmdin<1> signal 96 using an inverter 100.

Moreover, the flip-flop 84 functions similar to the flip-flops 80 and 82 except that the flip-flop 84 is clocked using the CmdinF<1> signal 98 instead of the signal 88 or the CmdinF<0> signal 92. Thus, the flip-flop 84 output (i.e., Cmdin<2> signal 102) toggles with every other (e.g., high) transition of the CmdinF<1> signal 98 due to the feedback of a CmdinF<2> signal 104 inverted from the Cmdin<2> signal 102 using an inverter 106.

Furthermore, the flip-flop 86 functions similar to the flip-flops 80, 82, and 84 except that the flip-flop 86 is clocked using the CmdinF<2> signal 102 instead of the signal 88, the CmdinF<0> signal 92, or the CmdinF<1> signal 98. Thus, the flip-flop 86 output (i.e., Cmdin<3> signal 108) toggles with every other transition of the CmdinF<2> signal 102 due to the feedback of a CmdinF<3> signal 110 inverted from the Cmdin<3> signal 108 using an inverter 112.

The flip-flops 80, 82, 84, and 86 may utilize differential clocking by using inverters 114 to create an inverted clock for each respective clock signal. Furthermore, the flip-flops 80, 82, 84, and 86 may receive a reset signal 116 that is used to reset the input counter 72 by resetting the flip-flops 80, 82, 84, and 86 to an initial state.

Figure 6:
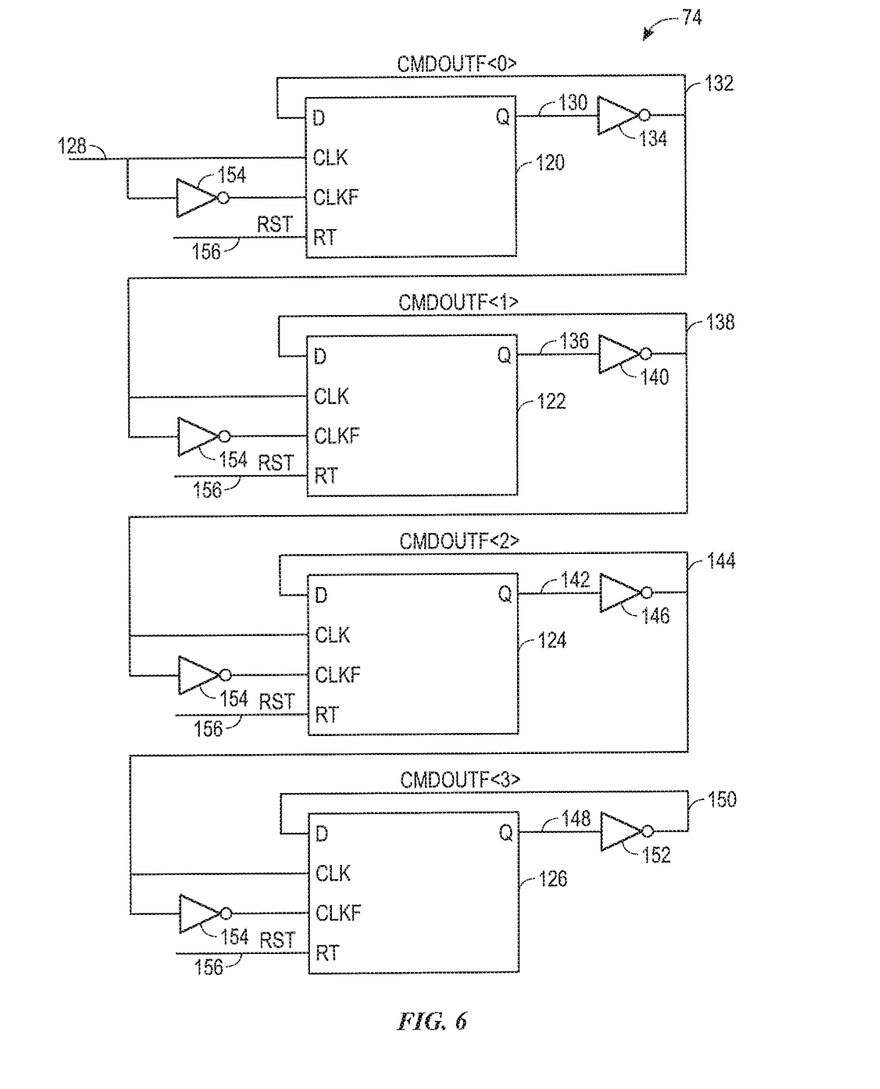
FIG. 6 is a schematic diagram of the output counter of FIG. 4, in accordance with an embodiment.

FIG. 6 illustrates a schematic diagram of an embodiment of the output counter 74 that functions similar to the input counter 72 previously described. Moreover, the output counter 74 is illustrated as a ripple counter. However, the output counter 74 may include any type of counter suitable for counting a number of commands entering the pipeline 18. In some embodiments, the input counter 72 and the output counter 74 may be implemented with the same or similar counter types. In other embodiments, the input counter 72 and the output counter 74 may be implemented using different counter types.

In the illustrated embodiment, the output counter 74 includes flip-flops 120, 122, 124, and 126. The flip-flop 120 receives a signal 128 (e.g., signal 42) indicative of a command 16 detected at or near a beginning of the pipeline 18. The signal 128, when transitioning high, clocks the flip-flop 120 causing the flip-flop 120 to output a Cmdout<0> signal 130. The output counter 74 then inverts the Cmdout<0> signal 130 to generate a CmdoutF<0> signal 132 using an inverter 134. The CmdoutF<0> signal 132 is then fed back into an input pin of the flip-flop 120 to cause the output of the flip-flop 120 to toggle on the next high transition of the signal 128. In other words, the output of the flip-flop 120 alternatively toggles high and low on receiving each (e.g., high) pulse of the signal 128.

The flip-flop 122 functions similar to the flip-flop 120 except that the flip-flop 122 is clocked using the CmdoutF<0> signal 132 instead of the signal 128. Thus, the flip-flop 122 output (i.e., Cmdout<1> signal 136) toggles with every other transition of the CmdoutF<0> signal 132 due to the feedback into the flip-flop 122 of a CmdoutF<1> signal 138 inverted from the Cmdout<1> signal 136 using an inverter 140.

Moreover, the flip-flop 124 functions similar to the flip-flops 120 and 122 except that the flip-flop 124 is clocked using the CmdoutF<1> signal 138 instead of the signal 128 or the CmdoutF<0> signal 132. Thus, the flip-flop 124 output (i.e., Cmdout<2> signal 142) toggles with every other (e.g., high) transition of the CmdoutF<1> signal 138 due to the feedback of a CmdoutF<2> signal 144 inverted from the Cmdout<2> signal 142 using an inverter 146.

Furthermore, the flip-flop 126 functions similar to the flip-flops 120, 122, and 124 except that the flip-flop 126 is clocked using the CmdoutF<2> signal 142 instead of the signal 128, the CmdoutF<0> signal 132, or the CmdoutF<1> signal 138. Thus, the flip-flop 126 output (i.e., Cmdout<3> signal 148) toggles with every other transition of the CmdoutF<2> signal 142 due to the feedback of a CmdoutF<3> signal 150 inverted from the Cmdout<3> signal 148 using an inverter 152.

The flip-flops 120, 122, 124, and 126 may utilize differential clocking by using inverters 154 to create an inverted clock for each respective clock signal. Furthermore, the flip-flops 120, 122, 124, and 126 may receive a reset signal 156 that is used to reset the output counter 74 by resetting the flip-flops 120, 122, 124, and 126 to an initial state.

Although the input counter 72 and the output counter 74 are both illustrated as capable of counting 15 commands in the pipeline 18, the input counter 72 and the output counter 74 may be implemented to count more commands or to count fewer commands. For example, the input counter 72 and the output counter 74 may include more flip-flops or fewer flip-flops to modify how many commands may be counted in each counter.

Figure 7:
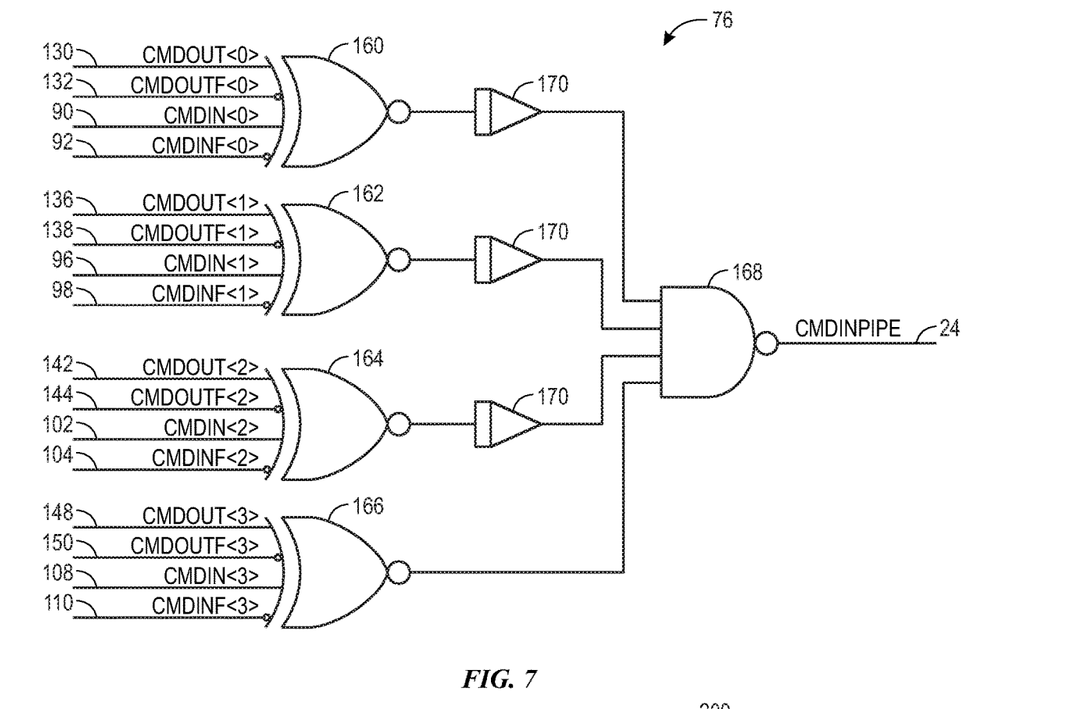
FIG. 7 is a schematic diagram of the comparison circuitry of FIG. 4, in accordance with an embodiment.

FIG. 7 illustrates a schematic diagram of an embodiment of the comparison circuitry 76. The comparison circuitry 76 receives the number in the input counter 72 and the output counter 74. For instance, the comparison circuitry 76 may receive bits from each flip-flop as signals. Although multiple signals are passed from the input counter 72 and/or the output counter 74 to the comparison circuitry 76, the input counter 72 and/or the output counter 74 may be implemented in non-critical locations that have more layout space available than in other locations (e.g., near the additive latency shifter). Instead, fewer (e.g., 2 instead of 32) lines included from the pipeline 18 location to the tracking circuitry 20 may reduce layout consumption in key locations and/or reduce routing distances used to provide signals to the tracking circuitry 20 and to implement the tracking circuitry 20.

As illustrated, the comparison circuitry 76 includes four exclusive NOR (XNOR) gates 160, 162, 164, and 166 that receive the bits as signals from the input counter 72 and the output counter 74. For instance, the XNOR gate 160 receives the Cmdout<0> signal 130 and the CmdoutF<0> signal 132 from the output counter 74. The XNOR gate 160 also receives the Cmdin<0> signal 92 and the CmdinF<0> signal 92 from the input counter 72. The inverted "false" signals (i.e., the CmdoutF<0> signal 132 and the CmdinF<0> signal 92) may be received at inverting inputs of the XNOR gate 160. Thus, the XNOR gate 160 outputs a logic low if 1 or 3 of the inputs (after applicable inversions) are logically high. Otherwise (e.g., 0, 2, or 4 inputs are logically high), the XNOR gate 160 outputs a logic high.

The XNOR gate 162 functions similar to the XNOR gate 160 except that the XNOR gate 162 receives the Cmdout<1> signal 136, the CmdoutF<1> signal 138, the Cmdin<1> signal 96, and the CmdinF<1> signal 98. Also, the XNOR gate 164 functions similar to the XNOR gates 160 and 162 except that the XNOR gate 164 receives the Cmdout<2> signal 142, the CmdoutF<2> signal 144, the Cmdin<2> signal 102, and the CmdinF<2> signal 104. Likewise, the XNOR gate 166 functions similar to the XNOR gates 160, 162, and 164 except that the XNOR gate 166 receives the Cmdout<3> signal 148, the CmdoutF<3> signal 150, the Cmdin<3> signal 108, and the CmdinF<3> signal 110.

The outputs of the XNOR gates 160, 162, 164, and 166 are transmitted to a NAND gate 168. The NAND gate 168 outputs a logic high as the CmdInPipe signal 24 unless all four XNOR gates 160, 162, 164, and 166 are logically high. In some embodiments, outputs from the XNOR gates 160, 162, and 164 may be delayed from the XNOR gates 160, 162, and 164 to the NAND gate 168 using delays 170 to enable propagation of the output of the XNOR gate 166 before generating the CmdInPipe signal 24. Furthermore, in some embodiments, the delays 170 may include a relatively short delay for the XNOR gate 164, a larger delay for the XNOR gate 162, and an even longer delay for the XNOR gate 160 to cause the outputs of the XNOR gates 160, 162, 164, and 166 to arrive at the NAND gate 168 at or about the same time.

Although the foregoing discussion discusses and FIG. 7 illustrates each gate 160, 162, 164, and 166 receiving four inputs from respective counters, in some embodiments, fewer signals may be received at the gates 160, 162, 164, and 166. For instance, the gates 160, 162, 164, and 166 may each receive only one signal (e.g., total of 4 signals) from respective counters for each true/false signal pair rather than both signals (e.g., total of 8 signals) being routed from the respective counters to the gates 160, 162, 164, and 166. Furthermore, in some embodiments, signals (e.g., CmdOutF<0> signal 132) that are not routed from the respective counters may be generated locally in the comparison circuitry 76 from an opposite polarity signal (e.g., CmdOut<0> signal 130). Alternatively, only the signals that are routed are used in the gates 160, 162, 164, and 166.

Figure 8:
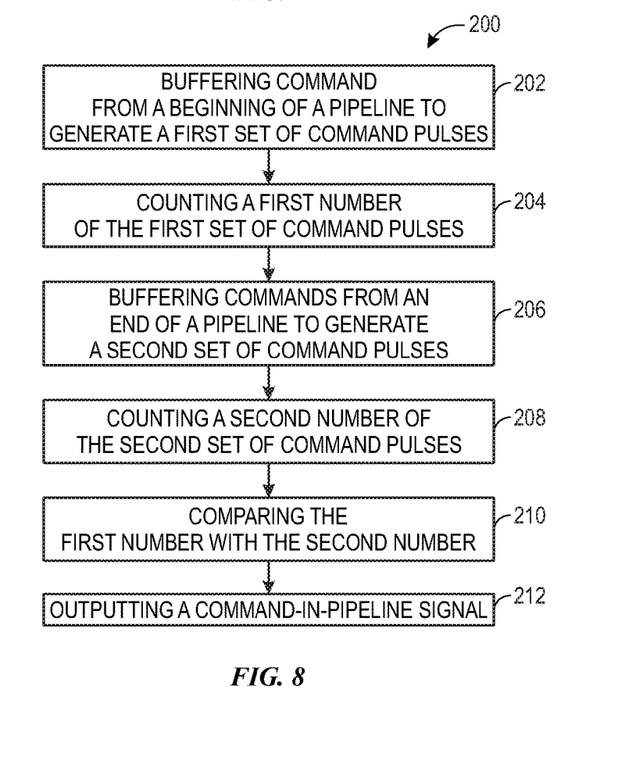
FIG. 8 is a block diagram of a process used to determine whether a command is in the pipeline of FIG. 1, in accordance with an embodiment.

FIG. 8 is a flow diagram of a process 200 used to determine whether a command is in the pipeline 18. The memory device 10 buffers commands from a beginning of the pipeline 18 to generate a first set of command pulses (block 202). The pipeline is configured to process commands received by the memory device 10. Moreover, buffering the commands from the beginning of the pipeline 18 may include transmitting an indication of at least one of the commands from the beginning of the pipeline to the input counter 72. In some embodiments and as previously noted, the input counter 72 located physically away from the pipeline 18. The input counter 72 counts a first number of the first set of command pulses (block 204). The memory device also buffers the commands from an end of the pipeline to generate a second set of command pulses (block 206). Buffering the commands from the end of the pipeline may include transmitting an indication of at least one of the commands from the end of the pipeline to the output counter 74. In some embodiments and as previously noted, the output counter 74 may be located physically away from the pipeline 18. The output counter 74 counts a second number of the second set of command pulses (block 208). The comparison circuitry compares the first number with the second number (block 210). The comparison circuitry also outputs a command-in-pipeline signal that is configured to indicate that at least one of the commands is in the pipeline when the first number and the second number are not the same (block 212).

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes implementing similar functions.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
   a command interface configured to receive commands from a processor;
   a pipeline configured to process or control timing of the commands received by the memory device; and
   tracking circuitry configured to determine whether one or more of the commands are in the pipeline, wherein the tracking circuitry comprises:
     an input counter configured to count commands entering into the pipeline;
     an output counter configured to count commands exiting the pipeline; and
     comparison circuitry configured to compare values in the input counter and the output counter and to output a command-in-pipeline signal indicative of the one or more commands being in the pipeline when the values in the input counter and the output counter differ.

2. The memory device of claim 1, wherein the input counter is configured to receive an indication of the commands before a first flip-flop of the pipeline.

3. The memory device of claim 1, wherein the output counter is configured to receive an indication of the commands after a last flip-flop of the pipeline.

4. The memory device of claim 1, wherein the input counter comprises a ripple counter.

5. The memory device of claim 1, wherein the output counter comprises a ripple counter.

6. The memory device of claim 1, wherein the comparison circuitry comprises an exclusive NOR (XNOR) gate configured to:
   receive, at a first input terminal of the XNOR, a first bit of the values from the input counter;
   receive, at a second terminal of the XNOR, a second bit of the values from the output counter; and
   output an output signal based at least in part on the first bit and the second bit.

7. The memory device of claim 6, wherein the XNOR gate is configured to:
   receive, at a third input terminal of the XNOR, a third bit of the values, wherein the third bit is a complement of the first bit, and the third input terminal is an inverting terminal; and
   receive, at a fourth input terminal of the XNOR, a fourth bit of the values, wherein the fourth bit is a complement of the second bit, and the fourth input terminal is an inverting terminal, and the output signal is based at least in part on the third bit and fourth bit in addition to the first bit and second bit.

8. The memory device of claim 7, wherein the comparison circuitry comprises a NAND gate, and the output signal is transmitted from the XNOR gate to a NAND gate that generates the command-in-pipeline signal based on the output signal of the XNOR gate and an additional output signal of an additional XNOR gate.

9. The memory device of claim 8, wherein the comparison circuitry comprises a delay configured to delay the output signal of the XNOR gate to synchronize the output signal with the additional output signal.

10. The memory device of claim 1, wherein the memory device comprises a double data rate type 4 (DDR4) synchronous dynamic random-access memory (SDRAM) device or a double data rate type 5 (DDR5) SDRAM device.

11. A method comprising:
    receiving commands at a command interface of a memory device from a host processor, wherein the commands comprises read commands or write commands sent to the memory device from the host processor;
    buffering the commands from a beginning of a pipeline to generate a first set of command pulses, wherein the pipeline is configured to process commands;
    counting a first number of the first set of command pulses in an input counter;
    buffering the commands from an end of the pipeline to generate a second set of command pulses;
    counting a second number of the second set of command pulses in an output counter;
    comparing, using comparison circuitry, the first number with the second number; and
    outputting a command-in-pipeline signal that is configured to indicate that at least one of the commands is in the pipeline when the first number and the second number are not the same.

12. The method of claim 11, wherein buffering the commands from the beginning of the pipeline comprises transmitting an indication of at least one of the commands from the beginning of the pipeline to the input counter.

13. The method of claim 11, wherein buffering the commands from the end of the pipeline comprises transmitting an indication of the at least one of the commands from the end of the pipeline to the output counter.

14. The method of claim 11, wherein comparing the first number with the second number comprises:
    transmitting the first number from the input counter to the comparison circuitry; and
    transmitting the second number from the output counter to the comparison circuitry.

15. The method of claim 11, wherein comparing the first number with the second number comprises passing corresponding bits of the first number and the second number to respective exclusive NOR (XNOR) gates of a plurality of XNOR gates of the comparison circuitry.

16. The method of claim 15, wherein passing corresponding bits of the first number and the second number to respective XNOR gates comprises:
 passing a first bit corresponding to a true value of an input bit from the input counter;
 passing a second bit corresponding to a complement value of the input bit;
 passing a third bit corresponding to a true value of an output bit from the output counter; and
 passing a fourth bit corresponding to a complement value of the output bit.

17. The method of claim 16, wherein passing the second bit comprises inverting the complement value at a first terminal of a respective XNOR gate, and passing the fourth bit comprises inverting the complement value at a second terminal of the respective XNOR gate.

18. A memory device comprising:
 a command interface configured to receive commands from a processor;
 a pipeline to process the commands received by the memory device; and
 tracking circuitry configured to:
  receive a first signal each time a command of the commands passes a first location of the pipeline;
  receive a second signal each time the command passes a second location of the pipeline;
  determine whether any of the commands are in the pipeline using the first and second signals as the only buffered signals from the pipeline to the tracking circuitry; and
  output a command-in-pipeline signal indicative of whether any of the commands are in the pipeline.

19. The memory device of claim 18, wherein the pipeline comprises a plurality of flip-flops, and the first location comprises a point before a first flip-flop of the plurality of flip-flops.

20. The memory device of claim 18, wherein the pipeline comprises a plurality of flip-flops, and the second location comprises a point after a last flip-flop of the plurality of flip-flops.

21. The memory device of claim 18, wherein the tracking circuitry comprises:
 an input counter configured to count occurrences of the first signal;
 an output counter configured to count occurrences of the second signal; and
 comparison circuitry, wherein determining whether any of the commands are in the pipeline comprises comparing values, using the comparison circuitry, in the input counter and the output counter and determining that at least one of the commands are in the pipeline when values in the input counter and the output counter are different.

\* \* \* \* \*